(12) United States Patent
Yi

(10) Patent No.: US 6,833,744 B2
(45) Date of Patent: Dec. 21, 2004

(54) CIRCUIT FOR CORRECTING DUTY FACTOR OF CLOCK SIGNAL

(75) Inventor: Seung Hyun Yi, Uileongbu-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/688,685

(22) Filed: Oct. 17, 2003

(65) Prior Publication Data
US 2004/0085111 A1 May 6, 2004

(30) Foreign Application Priority Data
Oct. 18, 2002 (KR) ................................ 10-2002-0063678

(51) Int. Cl.[7] .............................................. H03K 3/017
(52) U.S. Cl. ...................................... 327/175; 327/176
(58) Field of Search ................................. 327/175, 176, 327/173, 174, 149, 153, 158, 161, 270, 271, 276

(56) References Cited

U.S. PATENT DOCUMENTS 6,642,760 B1 * 11/2003 Alon et al. ................. 327/158
2002/0172314 A1 * 11/2002 Lin et al. .................... 375/376
2002/0180501 A1 * 12/2002 Baker et al. ................ 327/158

\* cited by examiner

*Primary Examiner*—Linh M. Nguyen
(74) *Attorney, Agent, or Firm*—Lee, Hong, Degerman, Kang & Schmadeka

(57) ABSTRACT

Circuit for correcting a duty factor of a clock signal, including a phase comparator for detecting a phase difference of an input clock signal having a duty factor to be corrected, and a corrected clock signal having the duty factor corrected, and generating a shift control signal, a control signal generating part for shifting a clock generating reference signal in response to the shift control signal, and delaying the clock generating reference signal for a preset time period to generate 180° and 360° clock generating control signals, and a clock signal generating part for generating a clock signal having a corrected duty factor according to the 180° and 360° clock generating control signals.

20 Claims, 4 Drawing Sheets

CIRCUIT FOR CORRECTING DUTY FACTOR OF CLOCK SIGNAL

This application claims the benefit of the Korean Application No. P2002-63678 filed on Oct. 18, 2002, which is hereby incorporated by reference.

BACKGROUND OF THE INVENTION

1. Field of the Invention

The present invention relates to a circuit for correcting a duty factor of a clock signal, and more particularly, a circuit for correcting a duty factor of a clock signal by using a two delay loops.

2. Background of the Related Art

In general, when an application circuit, such as a VLSI (Very Large Scale Integration), is operative in response to a clock signal, there is a case when a clock signal provided to the application circuit is involved in failure in sustaining a 50% duty factor exactly, but variation of the duty factor.

The duty, factor is a value a high state time period of the clock signal is divided by a cyclic period of the clock signal. If the duty factor fails to be sustained at 50% exactly, the application circuit operative at a rising edge and a falling edge of the clock signal malfunctions. Therefore, it is required that the duty factor is corrected so to be 50%, exactly.

There are many known circuits for correcting the duty factor to be 50%. However, most of the circuits are analogous, with a complicate system and difficulty in fabrication. Moreover, there is a difficulty in designing a tailor made correcting circuit for every application circuit.

SUMMARY OF THE INVENTION

Accordingly, the present invention is directed to a circuit for correcting a duty factor of a clock signal that substantially obviates one or more of the problems due to limitations and disadvantages of the related art.

An object of the present invention is to provide a circuit for correcting a duty factor of a clock signal, for correcting a duty factor of a clock signal to be 50%, exactly.

Another object of the present invention is to provide a circuit for correcting a duty factor of a clock signal, which has a simple system, and is easy to fabricate.

Further object of the present invention is to provide a circuit for correcting a duty factor of a clock signal, which is applicable to any kind of application circuit, easily.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the circuit for correcting a duty factor of a clock signal, includes a phase comparator for detecting a phase difference of an input clock signal having a duty factor to be corrected, and a corrected clock signal having the duty factor corrected, and generating a shift control signal, a control signal generating part for shifting a clock generating reference signal in response to the shift control signal, and delaying the clock generating reference signal for a preset time period to generate 180° and 360° clock generating control signals, and a clock signal generating part for generating a clock signal having a corrected duty factor according to the 180° and 360° clock generating control signals.

The control signal generating part includes a shift register for shifting the clock generating reference signal in a left/right direction in response to a shift control signal, a synchronized signal providing part for synchronizing a shifted clock generating reference signal to the input clock signal, a first delay loop for delaying the synchronized clock generating reference signal for a preset time period, to provide as a 180° clock generating phase signal, and a second delay loop for delaying the synchronized clock generating reference signal for a preset time period, to provide as a 360° clock generating phase signal.

The shift register stores a high voltage as the clock generating reference signal, and shifts the clock generating reference signal, the first delay loop delays the clock generating reference signal for a preset time period set according to a shifted position of the clock generating reference signal, and the second delay loop delays the clock generating reference signal for a time period two times longer than a delay time period delayed by the first delay loop.

The first or second loop includes a plurality of delays disposed between output terminals of the synchronized signal providing part.

The clock signal generating part includes a correction delay for delaying the 360° clock generating control signal, a first pulse signal generator for generating a pulse signal in response to the 360° clock generating control signal delayed at the correction delay, a second pulse signal generator for generating a pulse signal in response to the 180° clock generating control signal, and a corrected clock signal generator for generating clock signals respectively having 360° and 180° phases in response to the pulse signals from the first pulse signal generator and the second pulse signal generator.

The correction delay delays a time period required from a time the first and second pulse signal generators generate pulse signals to a time the clock signal generating part generates clock signals having 360° and 180° in response to the generated pulse signals.

The first or second pulse signal generator includes a first inverter group for delaying and inverting an output signal from the correction delay or the 180° clock generating control signal from the control signal generating part, an NAND gate having a first terminal for receiving the output signal from the correction delay or the 180° clock generating control signal from the control signal generating part and a second terminal for receiving an output signal from the first inverter group, and a second inverter group for delaying and inverting an output signal from the NAND gate.

The first inverter group includes three inverters connected in series, and the second inverter group includes one inverter.

The corrected clock signal generator includes first and second transistors connected between power terminal Vdd and a ground in series, for receiving an output signal from the first and second pulse signal generators, and a plurality of inverters connected between the first and the second transistors.

The first transistor is a PMOS transistor, and the second transistor is an NMOS transistor, and the first transistor has a gate connected to an inverter for receiving an inverted output signal of the first pulse signal generator, and the second transistor has a gate connected to receive the output signal of the second pulse signal generator.

The plurality of inverters are first, second and third inverters, wherein the first and second inverters are connected in parallel to serve as a latch, and the third inverter is connected in series to the first or second inverter.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

The present invention suggests a circuit for correcting a duty factor of a clock signal by using two delay loops having a first delay loop with a preset delay time period, and a second delay loop with a delay time period two times of the delay time period of the first delay loop for correcting the duty factor to be 50%, exactly.

Figure 1:
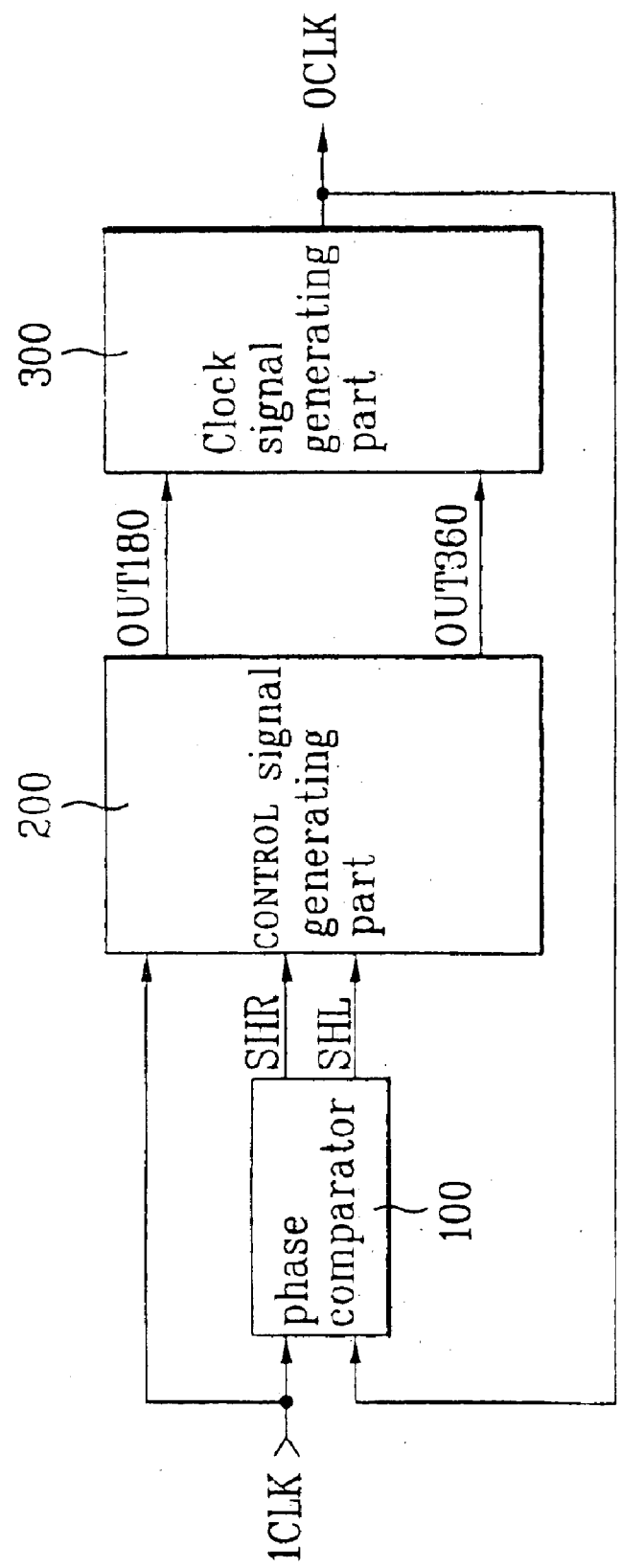
FIG. 1 illustrates a block diagram of a circuit for correcting a duty factor of a clock signal in accordance with a preferred embodiment of the present invention.

FIG. 1 illustrates a block diagram of a circuit for correcting a duty factor of a clock signal in accordance with a preferred embodiment of the present invention.

Referring to FIG. 1, the circuit for correcting a duty factor of a clock signal includes a phase comparator 100, a control signal generating part 200, and a clock signal generating part 300.

The phase comparator 100 detects a phase difference of an input clock signal ICLK having a duty factor to be corrected, and a corrected clock signal OCLK having the duty factor corrected, and generates a shift control signal SHL, or SHR, selectively. The control signal generating part 200 shifts a clock generating reference signal in left/right in response to the shift control signal SHL or SHR from the phase comparator 100. Then, by delaying a preset time period set according to a shifted position of the clock generating reference signal, a 180° clock generating control signal OUT180 is generated, and, along with this, by delaying the clock generating reference signal by two times of the preset time period, a 360° clock generating control signal OUT360 is generated. The clock signal generating part 300 generates a clock signal synchronized to the input clock signal ICLK and having a 50% duty factor according to the 180° clock generating control signal OUT180 and the 360° clock generating control signal OUT360 from the control signal generating part 200.

Figure 2:
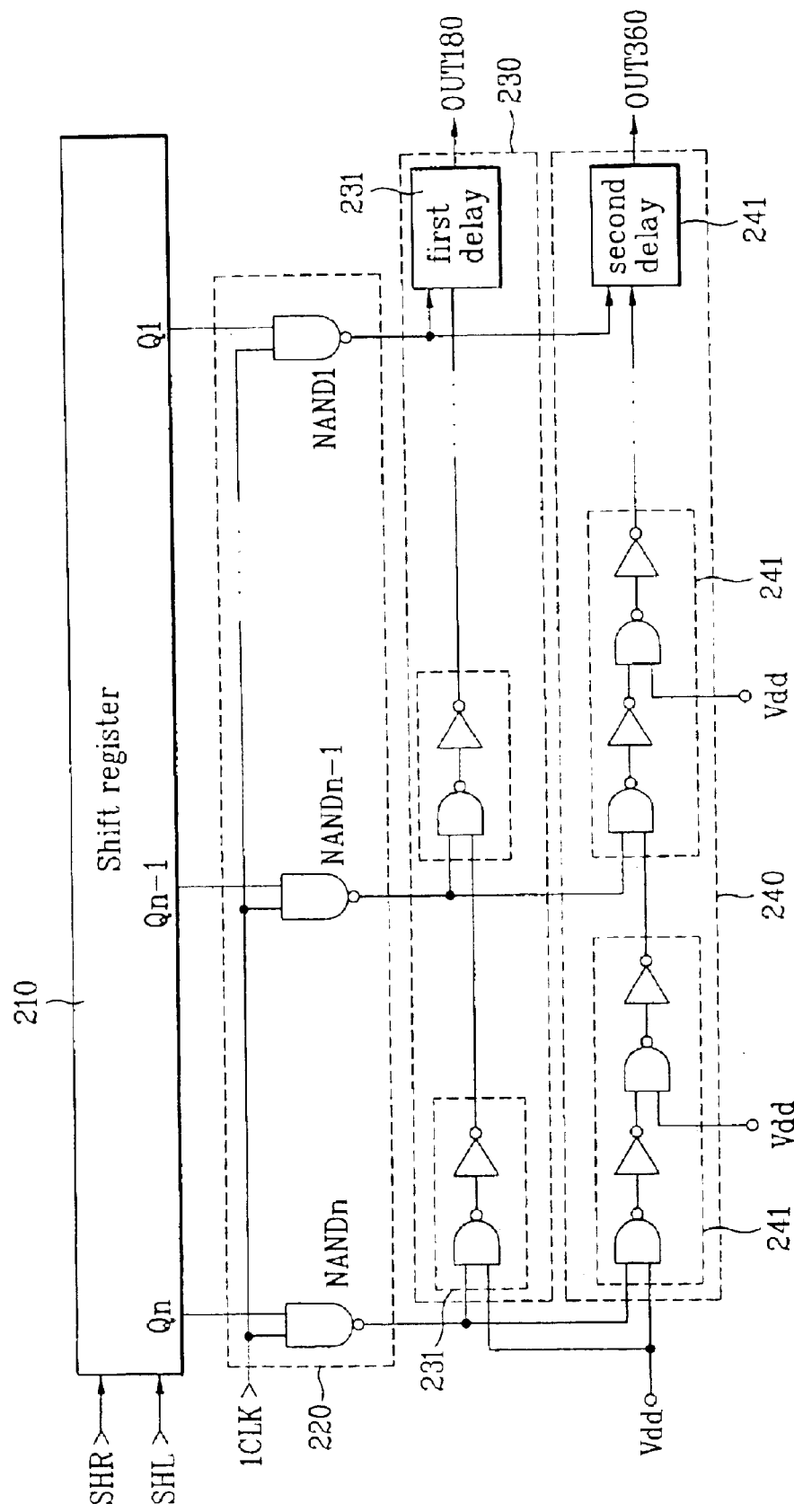
FIG. 2 illustrates a detailed system of the control signal generating part in FIG 1.

FIG. 2 illustrates a detailed system of the control signal generating part in FIG. 1.

Referring to FIG. 2, the control signal generating part 200 includes a shift register 210, a synchronized signal providing part 220, and first, and second delay loops 230 and 240. The first and second delay loops 230 and 240 include a plurality of first and second delays 231 and 241, respectively.

The synchronized signal providing part 220 synchronizes the clock generating reference signal from the shift register 210 to the input clock signal ICLK by using a plurality of NAND1~NANDn gates. The first and second delay loops 230 and 240 generate clock generating phase signals OUT180 and OUT360 by delaying the clock generating reference signal from the synchronized signal providing part 220 by one and two times of preset time period set according to a shift position of the clock reference signal, respectively. The first and second delay loops 230 and 240 between a plurality of output terminals of the synchronized signal providing part 220 include the plurality of first and second delays 231 and 241 for delaying one and two times of a unit time period.

Figure 3:
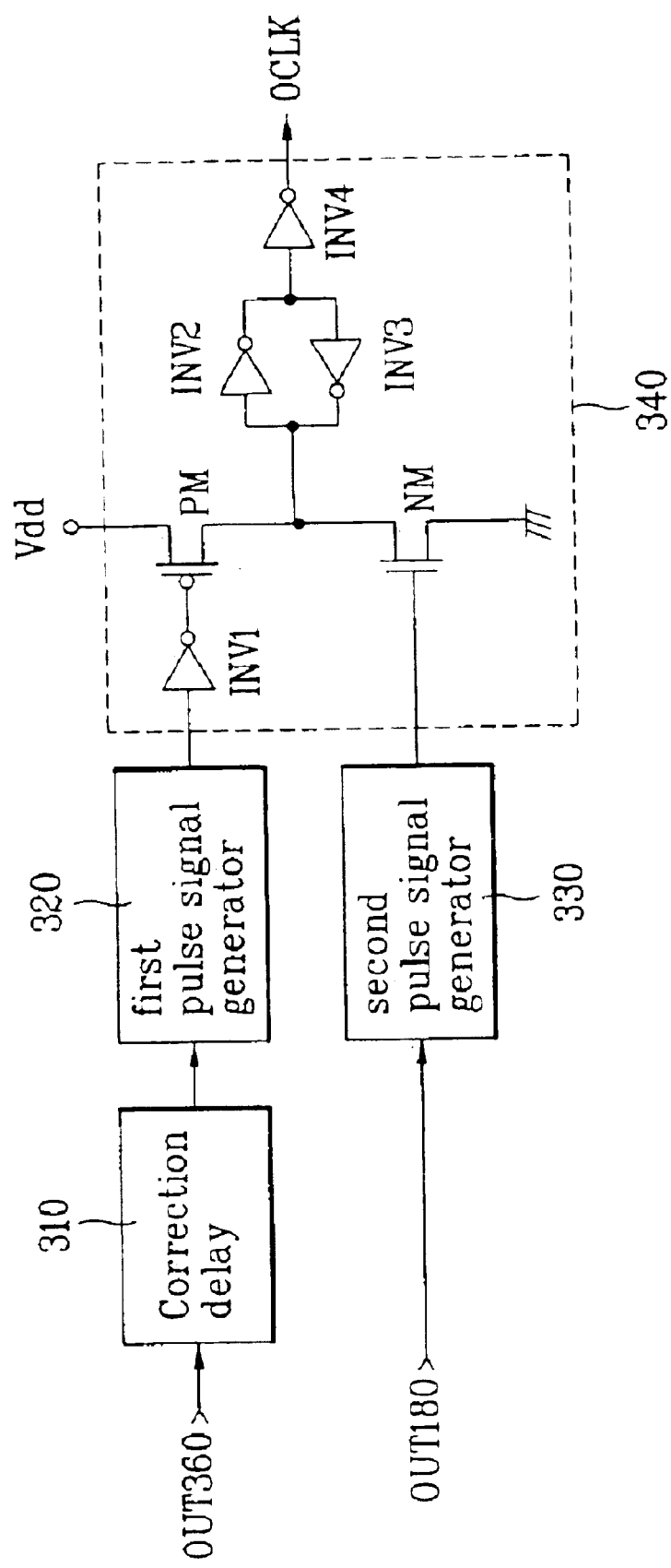
FIG. 3 illustrates a detailed system of the clock signal generating part in FIG 1.

FIG. 3 illustrates a detailed system of the clock signal generating part in FIG. 1.

Referring to FIG. 3, the clock signal generating part 300 includes a correction delay 310 for delaying the 360° clock generating control signal OUT360, a first pulse signal generator 320 for generating a pulse signal in response to the 360° clock generating control signal OUT360 delayed at the correction delay 310, a second pulse signal generator 330 for generating a pulse signal in response to the 180° clock generating control signal OUT180, and a corrected clock signal generator 340 for generating clock signals respectively having 360° and 180° phases in response to the pulse signals from the first pulse signal generator 320 and the second pulse signal generator 330.

The corrected clock signal generator 340 includes first and second transistors connected in series between a power terminal Vdd and ground, for receiving signals from the first and second pulse signal generators respectively, and a plurality of inverters connected between the first and second transistors. The first transistor is a PMOS transistor, and the second transistor is an NMOS transistor, wherein the first transistor has a gate connected to an inverter for receiving a signal from the first pulse signal generator inverted by the inverter, and the second transistor has a gate for receiving a signal from the second pulse signal generator. The plurality of inverters include first, second, and third inverters, wherein the first and second inverters are connected in parallel for making latch operation, and the third inverter is connected to the first and second inverters in series.

That is, referring to FIG. 3, the PMOS transistor PM and the NMOS transistor NM are connected in series between the power terminal Vdd and the ground, wherein an output terminal of the first pulse signal generator 320 is connected to the gate of the PMOS transistor PM through the inverter INV1, and an output terminal of the second pulse signal generator 330 is connected to the gate of the NMOS transistor NM. A connection point of the PMOS transistor PM and the NMOS transistor NM is connected to an output terminal of the inverter INV4 through the inverters INV2 and INV3 operative as a latch, for providing the corrected clock signal OCLK from the output terminal of the inverter INV4.

Figure 4:
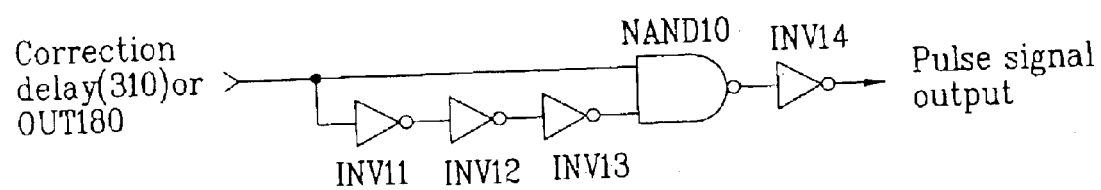
FIG. 4 illustrates the first or second pulse signal generating part in FIG. 3.

FIG. 4 illustrates the first or second pulse signal generating part in FIG. 3.

The first or second pulse signal generator 330 may include a first inverter group for delaying and inverting an output signal from the correction delay or the 180° clock generating control signal from the control signal generating part, an NAND gate having a first terminal for receiving the output signal from the correction delay or the 180° clock generating control signal from the control signal generating part and a second terminal for receiving an output signal from the first inverter group, and a second inverter group for delaying and inverting an output signal from the NAND gate.

The first inverter group has three inverters connected in series, and the second inverter group has one inverter.

That is, referring to FIG. 4, as the output terminal of the correction delay 310 or the output terminal of the control signal generating part 200 for generating the 180° clock generating control signal OUT180 is connected to one input terminal of the NAND gate NAND10, a plurality of delay inverters INV11, INV12, and INV13 connected in series is connected to the other input terminal of the NAND gate NAND10, and an output terminal of an inverter INV14 is connected to an output terminal of the NAND gate NAND10, for providing the pulse signal from the output terminal of the inverter INV14.

The operation of the circuit for correcting a duty factor of a clock signal of the present invention will be described.

The phase comparator 100 receives, and detects a phase difference of, the input clock signal ICLK having the duty factor to be corrected, and the corrected clock signal OCLK having the duty factor corrected, selectively generates a shift control signal SHL, or SHR according to the detected phase difference, and provides to the control signal generating part 200. For an example, if a phase of the corrected clock signal OCLK is faster than a phase of the input clock signal ICLK, the comparator provides the shift control signal that orders a left shift to the control signal generating part 200, and if the phase of the corrected clock signal OCLK is slower than the phase of the input clock signal ICLK, the comparator provides the shift control signal that orders a right shift to the control signal generating part 200.

Then, the shift register 210 in the control signal generating part 200 stores a high voltage clock generating reference signal at one output terminal, and low voltages at other output terminals.

Then, the shift register 210 shifts the high voltage clock generating reference signal to left or right depending on the shift control signal SHL, or SHR from the phase comparator 100, and provides to the synchronized signal providing part 220.

Next, one of the NAND gates NAND1~NANDn in the synchronized signal providing part 220 inverts the high voltage clock generating reference signal to a low voltage, and provides to the first and second delay loops 230 and 240 in response to the input clock signal ICLK.

The plurality of first and second delays 231 and 241 in the first and second loops 230 and 240 delay the preset time period set according to the shifted position of the received input clock generating reference signal by one and two times respectively, to convert the received clock generating reference signal into the 180° clock generating control signal OUT180 and the 360° clock generating control signal OUT360 respectively, and provide to the clock signal generating part 300.

For an example, if it is assumed that the clock generating reference signal is provided from an output terminal Q1 of the shift register 210, the clock generating reference signal is inverted at the NAND gate NAND1 and delayed at one of the first delays 231 in the first delay loop 230, to be provided as the 180° clock generating control signal OUT180, and at the same time with this, delayed at one of the second delays 241 in the second delay loop 240 having a delay time period two times of the first delays 231, to be provided as the 360° clock generating control signal OUT360. If it is assumed that the clock generating reference signal is provided from the output terminal Q2 of the shift register 210, the clock generating reference signal is inverted at the NAND gate NAND2, delayed at two first delays 231 in the first delay loop 230 in succession, to be provided as the 180° clock generating control signal OUT180, and, at the same time with this, delayed at the two second delays 241 in the second delay loop 240 in succession, to be provided as the 360° clock generating control signal OUT360, and if it is assumed that the clock generating reference signal is provided from an output terminal Qn of the shift register 210, the clock generating reference signal is inverted at the NAND gate NANDn, and delayed at the n first delays 231 in the first delay loop 230, to be provided as the 180° clock generating control signal OUT 180, and, at the same time with this, delayed at the n second delays 241 in the second delay loop 240 in succession, to be provided as the 360° clock generating control signal OUT360. That is, the control signal generating part 200 shifts the clock generating reference signal with the shift register 210, and delays the shifted clock generating reference signal with the plurality of first delays 231 in the first delay loop 230, to provide the 180° clock generating control signal OUT180, and delays the clock generating reference signal for a delay time period two times of a delay time period of the 180° clock generating control signal OUT180 with the plurality of second delays 241 in the second delay loop 240, to provide the 360° clock generating control signal OUT360.

The 360° clock generating control signal OUT360 from the control signal generating part 200 is delayed at the correction delay 310 in the clock signal generating part 300 for a preset time period, and provided to the first pulse signal generator 320, and the 180° clock generating control signal OUT180 is provided to the second pulse signal generator 330.

In this instance, the correction delay 310 is set to have a delay time period to be one time of a time period required from a time the first and second pulse signal generators 320 and 330 of the clock signal generating part 300 generate pulse signals in response to the clock generating phase signal OUT360 and OUT180 to a time the corrected clock signal generator 340 generates the corrected clock signal OCLK in response to the generated pulse signals.

Since the 360° clock generating control signal OUT360 or the 180° clock generating control signal OUT180 from the first or second delay loop 230 or 240 is provided to one side input terminal of the NAND gate NAND10, and, at the same time with, delayed and inverted at the plurality of delay inverters INV11~INV13 in succession, and provided to the other side input terminal of the NAND gate NAND10, the first or second pulse signal generator 320 or 330 generates a low voltage pulse signal of a preset bandwidth with the NAND gate NAND10, and inverts the low voltage pulse signal into a high voltage pulse signal with the inverter INV14.

Since the high voltage pulse signal which the first clock signal generator 320 generates in response to the 360° clock generating control signal OUT360 is inverted into a low voltage pulse signal at the inverter INV1 in the corrected clock signal generator 340, and provided to the gate of the PMOS transistor PM, the PMOS transistor PM becomes conductive, so that a high voltage of the power terminal Vdd passes through the PMOS transistor PM, is inverted and stored in the latch of the inverters INV2 and INV3, and inverted at the inverter INV4 again before being forwarded.

Since the high voltage pulse signal which the second clock signal generator 330 generates in response to the 180° clock generating control signal OUT180 is provided to the gate of the NMOS transistor NM in the corrected clock signal generator 340, the NMOS transistor NM becomes conductive, so that the latch provides a high voltage as a signal stored in the latch of the inverters INV2 and INV3 flows to the ground through the NMOS transistor NM, which is inverted into a low voltage at the inverter INV4 before being forwarded.

Thus, the corrected clock signal generator 340 provides a corrected clock signal OCLK which becomes a high voltage in response to the 360° clock generating control signal OUT360, and a low voltage in response to the 180° clock generating control signal OUT180.

In this instance, since the corrected clock signal OCLK from the corrected clock signal generator 340 is provided to, and compared to the input clock signal ICLK with respect to phases at, the phase comparator 100, one of high voltages which is a delayed value stored in the shift register 210 in the control signal generating part 200 according to a result of the comparison is shifted, to generate the 360° clock generating control signal OUT360, and the corrected clock signal generator 340 sets a 360° of the corrected clock signal OCLK in response to the generated 360° clock generating control signal OUT360, the 360° of the corrected clock signal OCLK is the same with a position of the 360° of the input clock signal.

Moreover, since the 360° clock generating control signal OUT360 is generated by delaying the clock generating reference signal from the synchronized signal providing part 220 in the control signal generating part 200 for two times of a preset signal set according to a shifted position of the clock generating reference signal at the plurality of second delays 241 in the second loop 240, and, since the 180° clock generating control signal OUT180 is generated as the first delays 231 in the first delay loop 230 having the same number of units with the second delays 241 each with a delay time period ½ of the second delay 241 delays the same clock generating reference signal, the 180° clock generating control signal OUT180 from the control signal generating part 210 has a delay time period ½ of the delay time period of the 360° clock generating control signal OUT360, exactly.

All the delay time periods are the same, which are required from a time the first and second pulse signal generators 320 and 330 generate pulse signals respectively in response to the 360° clock generating control signal OUT360 and the 180° clock generating control signal OUT180 to a time the corrected clock signal generator 340 sets 360° and 180° phases in response to the pulse signals the first and second pulse signal generators 320 and 330 generate.

In this instance, it is set such that the correction delay 310 delays the 360° clock generating control signal OUT360 as much as the delay time period of the first and second pulse signal generators 320 and 330 and the corrected clock signal generator 340.

Then, since the delay time period required for the corrected clock signal generator 340 to set a 180° phase of the clock signal in response to the 180° clock generating control signal OUT180 the control signal generating part 200 provides is ½ of the delay time period required for the corrected clock signal generator 340 to set a 360° phase of the clock signal in response to the 360° clock generating control signal OUT360 the control signal generating part 200 provides, the clock signal generating part 300 can generate a corrected clock signal OCLK having the same phase with the input clock signal ICLK and an exact 50% duty factor.

As has been described, since the circuit for correcting a duty factor of a clock signal of the present invention can generate a corrected clock signal having the same phase with the input clock signal and an exact 50% duty factor by using a plurality of first and second delays, a system of the circuit is simple, fabrication of the circuit is easy, and the circuit is applicable to different application circuits.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A circuit for correcting a duty factor of a clock signal, comprising:

a phase comparator for detecting a phase difference of an input clock signal having a duty factor to be corrected, and a corrected clock signal having the duty factor corrected, and generating a shift control signal;

a control signal generating part for shifting a clock generating reference signal in response to the shift control signal, and delaying the clock generating reference signal for a preset time period to generate 180° and 360° clock generating control signals;

wherein the control signal generating part comprises a synchronized signal providing part for synchronizing a shifted clock generating reference signal to the input clock signal, a first delay loop for delaying the synchronized clock generating reference signal for a preset time period, to provide as a 180° clock generating phase signal, and a second delay loop for delaying the synchronized clock generating reference signal for a preset time period, to provide as a 360° clock generating phase signal; and a clock signal generating part for generating a clock signal having a corrected duty factor according to the 180° and 360° clock generating control signals;

wherein the clock signal generating part comprises a correction delay for delaying the 360° clock generating control signal, a first pulse signal generator for generating a pulse signal in response to the 360° clock generating control signal delayed at the correction delay, and a second pulse signal generator for generating a pulse signal in response to the 180° clock generating control signal.

2. The circuit as claimed in claim 1, wherein the corrected clock signal provided to the phase comparator is corrected such that a duty factor thereof is 50%.

3. The circuit as claimed in claim 1, wherein the control signal generating part shifts the clock generating reference signal in left/right direction.

4. The circuit as claimed in claim 1, wherein the control signal generating part delays a preset time period set according to a shifted position of the clock generating reference signal.

5. A circuit for correcting a duty factor of a clock signal, comprising:

a phase comparator for detecting a phase difference of an input clock signal having a duty factor to be corrected, and a corrected clock signal having the duty factor corrected, and generating a shift control signal;

a control signal generating part for shifting a clock generating reference signal in response to the shift control signal, and delaying the clock generating reference signal for a preset time period to generate 180° and 360° clock generating control signals; and a clock signal generating part for generating a clock signal having a corrected duty factor according to the 180° and 360° clock generating control signals;

wherein the control signal generating part comprises:

a shift register for shifting the clock generating reference signal in a left/right direction in response to the shift control signal;

a synchronized signal providing part for synchronizing a shifted clock generating reference signal to the input clock signal;

a first delay loop for delaying the synchronized clock generating reference signal for a preset time period, to provide as a 180° clock generating phase signal; and a second delay loop for delaying the synchronized clock generating reference signal for a preset time period, to provide as a 360° clock generating phase signal.

6. The circuit as claimed in claim 5, wherein the shift register stores a high voltage as the clock generating reference signal, and shifts the clock generating reference signal.

7. The circuit as claimed in claim 5, wherein the first delay loop delays the clock generating reference signal for a preset time period set according to a shifted position of the clock generating reference signal.

8. The circuit as claimed in claim 5, wherein the second delay loop delays the clock generating reference signal for a time period two times longer than a delay time period delayed by the first delay loop.

9. The circuit as claimed in claim 5, wherein the first or second loop includes a plurality of delays disposed between output terminals of the synchronized signal providing part.

10. A circuit for correcting a duty factor of a clock signal, comprising:

a phase comparator for detecting a phase difference of an input clock signal having a duty factor to be corrected, and a corrected clock signal having the duty factor corrected, and generating a shift control signal;

a control signal generating part for shifting a clock generating reference signal in response to the shift control signal, and delaying the clock generating reference signal for a preset time period to generate 180° and 360° clock generating control signals; and a clock signal generating part for generating a clock signal having a corrected duty factor according to the 180° and 360° clock generating control signals;

wherein the clock signal generating part comprises:

a correction delay for delaying the 360° clock generating control signal;

a first pulse signal generator for generating a pulse signal in response to the 360° clock generating control signal delayed at the correction delay;

a second pulse signal generator for generating a pulse signal in response to the 180° clock generating control signal; and a corrected clock signal generator for generating clock signals respectively having 360° and 180° phases in response to the pulse signals from the first pulse signal generator and the second pulse signal generator.

11. The circuit as claimed in claim 10, wherein the correction delay delays a time period required from a time the first and second pulse signal generators generate pulse signals to a time the clock signal generating part generates clock signals having 360° and 180° in response to the generated pulse signals.

12. The circuit as claimed in claim 10, wherein the first or second pulse signal generator includes a first inverter group for delaying and inverting an output signal from the correction delay or the 180° clock generating control signal from the control signal generating part, an NAND gate having a first terminal for receiving the output signal from the correction delay or the 180° clock generating control signal from the control signal generating part and a second terminal for receiving an output signal from the first inverter group, and a second inverter group for delaying and inverting an output signal from the NAND gate.

13. The circuit as claimed in claim 12, wherein the first inverter group includes three inverters connected in series.

14. The circuit as claimed in claim 12, wherein the second inverter group includes one inverter.

15. The circuit as claimed in claim 10, wherein the corrected clock signal generator includes:

first and second transistors connected between power terminal Vdd and a ground in series, for receiving an output signal from the first and second pulse signal generators, and a plurality of inverters connected between the first and the second transistors.

16. The circuit as claimed in claim 15, wherein the first transistor is a PMOS transistor, and the second transistor is an NMOS transistor.

17. The circuit as claimed in claim 15, wherein the first transistor has a gate connected to an inverter for receiving an inverted output signal of the first pulse signal generator, and the second transistor has a gate connected to received the output signal of the second pulse signal generator.

18. The circuit as claimed in claim 15, wherein the plurality of inverters are first, second and third inverters, wherein the first and second inverters are connected in parallel to serve as a latch, and the third inverter is connected in series to the first or second inverter.

19. A circuit for correcting a duty factor of a clock signal, comprising:

a phase comparator for detecting a phase difference of a clock signal having a duty factor;

a control signal generating part for shifting a clock generating reference signal and delaying the clock generating reference signal for a preset time period to generate a first clock generating control signal and a second clock generating control signal; and a clock signal generating part for generating a clock signal having a corrected duty factor according to the first and second clock generating control signals;

wherein the control generating part comprises a synchronized signal providing part for synchronizing a shifted clock generating reference signal to an input clock signal, a first delay loop for delaying the synchronized clock generating reference signal for a preset period of time, to provide as a first clock generating phase signal, and a second delay loop for delaying the synchronized clock generating reference signal for a preset period of time, to provide as a second clock generating phase signal.

20. A circuit for correcting a duty factor of a clock signal, comprising:

a phase comparator for detecting a phase difference of a clock signal having a duty factor;

a control signal generating part for shifting a clock generating reference signal and delaying the clock generating reference signal for a preset time period to generate a first clock generating control signal and a second clock generating control signal; and a clock signal generating part for generating a clock signal having a corrected duty factor according to the first and second clock generating control signals;

wherein the clock signal generating part comprises a correction delay for delaying the second clock generating control signal, a first pulse signal generator for a generating a pulse signal in response to the second clock generating control signal delayed at the correction delay, and a second pulse signal generator for generating a pulse signal in response to the first clock generating control signal.

* * * * *